United States Patent
Horiguchi et al.

(10) Patent No.: US 6,506,257 B2
(45) Date of Patent: Jan. 14, 2003

(54) SINGLE-SUBSTRATE-PROCESSING APPARATUS FOR SEMICONDUCTOR PROCESS

(75) Inventors: Takahiro Horiguchi; Naofumi Oda; Hiroshi Kaneko, all of Tsukui-gun (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/870,798

(22) Filed: Jun. 1, 2001

(65) Prior Publication Data

US 2002/0007791 A1 Jan. 24, 2002

(30) Foreign Application Priority Data

Jun. 1, 2000 (JP) ........................................ 2000-164216

(51) Int. Cl.[7] .............................................. C23C 16/00
(52) U.S. Cl. .................... 118/725; 118/722; 118/729
(58) Field of Search .................. 118/722, 725, 118/729

(56) References Cited

U.S. PATENT DOCUMENTS 902,407 A * 5/1999 deBoer ........................ 118/725

FOREIGN PATENT DOCUMENTS

| JP | 52-69578 | 6/1977 |
|----|----------|--------|
| JP | 59-72127 | 4/1984 |
| JP | 61-42133 | 2/1986 |
| JP | 11-6069  | 1/1999 |

* cited by examiner

*Primary Examiner*—Richard Bueker
(74) *Attorney, Agent, or Firm*—Oblon, Spivak, McClelland, Maier & Neustadt, P.C.

(57) ABSTRACT

A single-substrate-processing apparatus includes an airtight process chamber in which a worktable is supported by a pedestal. The worktable has a mount face on which a plurality of ventilation grooves are formed. A plurality of ventilation holes and three lifter holes for lifter pins are formed vertically through the worktable. The gap space between the wafer and the mount face communicates with the inner space of the process chamber around the worktable and the wafer, through the ventilation grooves, the ventilation holes, and the lifter holes.

19 Claims, 4 Drawing Sheets

SINGLE-SUBSTRATE-PROCESSING APPARATUS FOR SEMICONDUCTOR PROCESS

CROSS-REFERENCE TO RELATED APPLICATIONS

This application is based upon and claims the benefit of priority from the prior Japanese Patent Application No. 2000-164216, filed Jun. 1, 2000, the entire contents of which are incorporated herein by reference.

BACKGROUND OF THE INVENTION

The present invention relates to a single-substrate-processing apparatus for performing a semiconductor process, such as oxidation, diffusion, film formation, or annealing. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or an LCD substrate, by forming semiconductor layers, insulating layers, and conductive layers in predetermined patterns on the target substrate.

In the process of manufacturing semiconductor devices, several types of heat-processing apparatuses are used for subjecting target substrates, such as semiconductor wafers, to a semiconductor process, such as oxidation, diffusion, film formation, or annealing. A single-substrate-processing apparatus, which handles wafers one by one, is known as one of these heat-processing apparatuses. The single-substrate-processing apparatus generally includes an airtight process chamber, and a worktable disposed in the process chamber for mounting a target substrate.

In the single-substrate-processing apparatus, there is a case where a wafer positionally shifts or laterally slides on the worktable, when the wafer is being placed on the worktable or the process chamber is being reduced in pressure. This is caused because the wafer temporarily falls in a floating state due to a gas present between the wafer and the worktable. For example, when a process gas in the process chamber is exhausted after a predetermined process, the pressure in the process chamber is quickly reduced from a process pressure by vacuum-exhaust. At this time, the gas present between the bottom of the wafer and the top of the worktable expands and floats the wafer up, whereby the wafer temporarily falls in a floating state and laterally slides.

In order to solve problems due to such a lateral slide of wafers, there is a countermeasure known in that a worktable is provided with a guide ring, positioning pins, or a recess. However, the countermeasure is not intended to essentially suppress or prevent a wafer from laterally sliding, but only to limit the lateral slide of the wafer to a certain range. Accordingly, when the wafer laterally slides and causes friction with an underlayer or hits the guide ring or the like, particles may be generated.

Jpn. Pat. Appln. KOKAI Publication No. 11-6069 discloses another countermeasure to the problems of laterally sliding wafers. In the technique disclosed in this publication, a single-substrate-processing apparatus of a lamp-heating type employs a thin table plate having a mount face on which three radial grooves are formed. The grooves are formed to correspond to three lifter holes in which lifter pins are respectively arranged to move a wafer up and down. The gap space between the wafer and the worktable communicates with the inner space of the process chamber through the grooves and the lifter holes. With this arrangement, it is possible to prevent the wafer from floating up or laterally sliding due to pressure changes.

However, the present inventors have found the following problems in the technique disclosed in this publication.

First, this technique does not sufficiently deal with wafers having a larger size. Specifically, as a wafer is larger, the surface area of a region distant from the lifter holes increases on the bottom of the wafer, so the release of gas from the bottom of the wafer becomes difficult.

Second, this technique does not sufficiently deal with worktables having a greater thickness, such as one with a built-in heater. Specifically, as a worktable is thicker, the conductance of the lifter holes decreases, so the release of gas from the bottom of the wafer becomes difficult.

BRIEF SUMMARY OF THE INVENTION

An object of the present invention is to provide a single-substrate-processing apparatus for a semi-conductor process, which prevents a wafer from positionally shifting or laterally sliding on a worktable, when the wafer is being placed on the worktable or a process chamber is being reduced in pressure.

According to a first aspect of the present invention, there is provided a single-substrate-processing apparatus for performing a semiconductor process, comprising:

an airtight process chamber;

a worktable having a mount face configured to horizontally support a target substrate within the process chamber;

a supply section configured to supply a process gas into the process chamber;

an exhaust section configured to vacuum-exhaust the process chamber;

a heater configured to heat the target substrate through the mount face;

a plurality of lifter pins configured to move the target substrate to and from the mount face, the lifter pins being respectively disposed in lifter holes formed through the worktable;

a plurality of ventilation holes formed through the worktable; and a plurality of ventilation grooves formed on the mount face, and comprising first ventilation grooves communicating with the lifter holes and second ventilation grooves communicating with the ventilation holes, the second ventilation grooves comprising radial grooves, which respectively have outer ends extending outward beyond a contour of the target substrate placed on the mount face;

wherein a gap space between the target substrate and the mount face communicates with an inner space of the process chamber around the worktable and the target substrate, through the first and second ventilation grooves, the ventilation holes, and the lifter holes.

According to a second aspect of the present invention, there is provided a single-substrate-processing apparatus for performing oxidation of a semiconductor process, comprising:

an airtight process chamber;

a worktable having a mount face configured to horizontally support a target substrate within the process chamber;

a pedestal standing upright in the process chamber and supporting the worktable;

a supply section configured to supply a process gas containing an oxidizing gas into the process chamber;

an exhaust section configured to vacuum-exhaust the process chamber;

a window formed in a casing of the process chamber and facing the worktable;

a UV lamp disposed outside the process chamber and facing the window, the UV lamp being configured to radiate UV rays onto the oxidizing gas above the worktable to activate the oxidizing gas;

a heater configured to heat the target substrate through the mount face;

a plurality of lifter pins configured to move the target substrate to and from the mount face, the lifter pins being respectively disposed in lifter holes formed through the worktable;

a plurality of ventilation holes formed through the worktable; and a plurality of ventilation grooves formed on the mount face, and comprising first ventilation grooves communicating with the lifter holes and second ventilation grooves communicating with the ventilation holes, the second ventilation grooves comprising radial grooves, which respectively have outer ends extending outward beyond a contour of the target substrate placed on the mount face;

wherein the first and second ventilation grooves, the ventilation holes, and the lifter holes are arranged substantially point-symmetric with respect to a center of the mount face, the lifter holes and the ventilation holes have openings surrounding the pedestal on a bottom of the worktable, and a gap space between the target substrate and the mount face communicates with an inner space of the process chamber around the worktable and the target substrate, through the first and second ventilation grooves, the ventilation holes, and the lifter holes.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
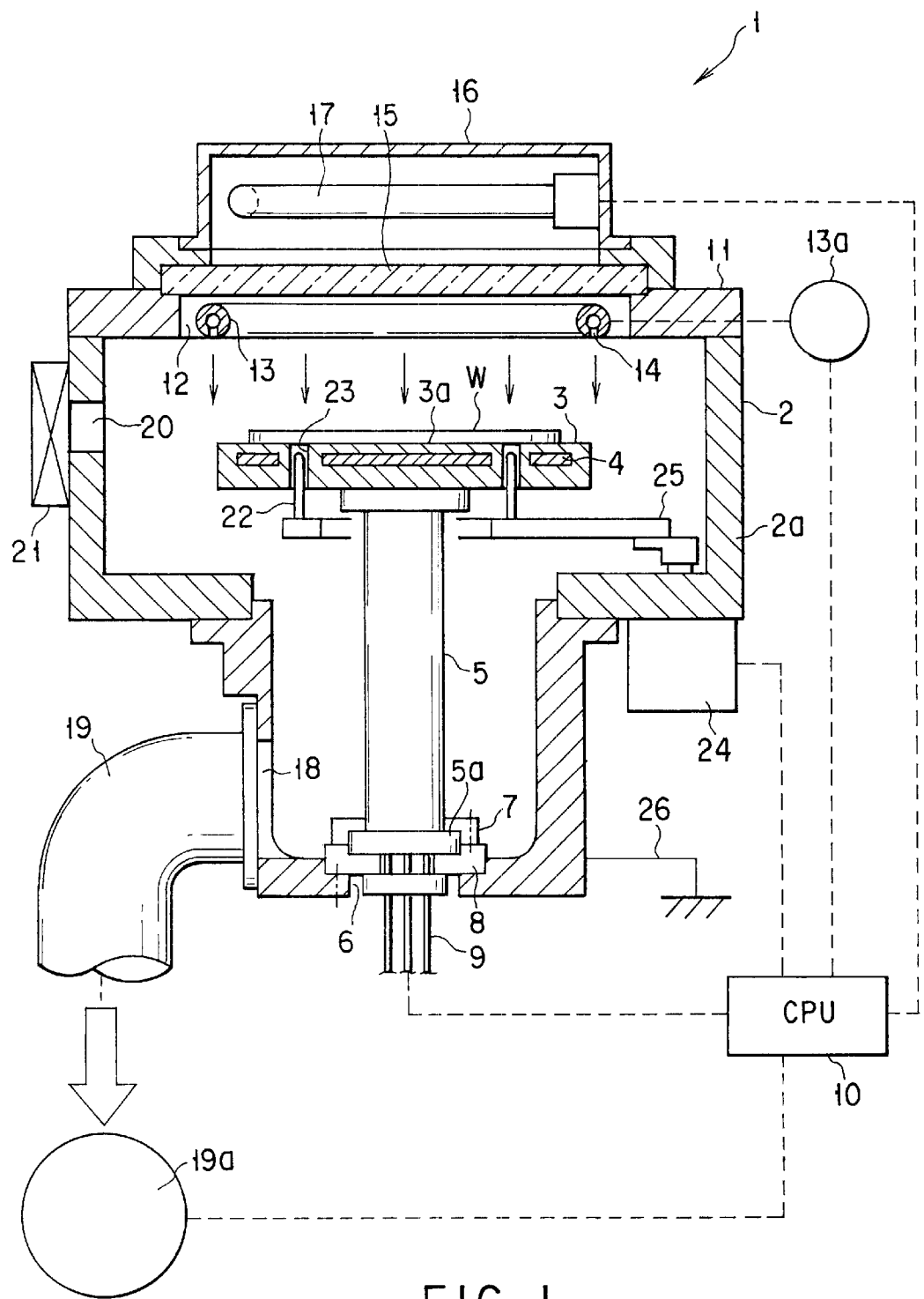
FIG. 1 is a schematic sectional view showing a single-substrate-processing apparatus according to an embodiment of the present invention.

Embodiments of the present invention will be described hereinafter with reference to the accompanying drawings. In the following description, the constituent elements having substantially the same function and arrangement are denoted by the same reference numerals, and a repetitive description will be made only when necessary.

FIG. 1 is a schematic sectional view showing a single-substrate-processing apparatus according to an embodiment of the present invention. This apparatus 1 is constituted as a single-substrate-processing apparatus for subjecting semiconductor wafers, i.e., target substrates, to oxidation one by one.

The single-substrate-processing apparatus 1 includes a process chamber 2 defined by a casing 2a made of a heat resistant material, such as a metal, preferably, aluminum. The inner surface of the casing 2a has been subjected to a surface treatment, such as an anodic oxidation treatment, to provide the surface with a corrosion resistance relative to a process gas, and to prevent metal contamination to a wafer. The core of the casing 2a is conductive, and is grounded by a ground line 2b.

In the process chamber 2, there is a circular worktable (susceptor) 3 having a circular mount face 3a, on which the wafer W is mounted. The worktable 3 consists essentially of a material, which is heat resistant, electrically insulating, and non-contaminating to the wafer W, such as one selected from the group consisting of a ceramic, e.g., sintered aluminum nitride (AlN); quartz; a metal coated with ceramic; and so forth. A resistance heater 4 for heating the wafer W through the worktable 3 is horizontally disposed and embedded in the worktable 3. As a result, the worktable 3 constitutes a so-called ceramic heater, which is clean without any metal contaminant relative to the wafer W. The resistance heater 4 is controlled by a CPU 10, so that the wafer W on the worktable 3 is heated to a predetermined temperature.

The worktable 3 is integratedly arranged on the top of a pedestal 5, which is disposed on the bottom of the casing 2a of the processing chamber 2 to stand upright. For example, the pedestal 5 is made of the same material as the worktable 3, such as a ceramic, and is formed of a hollow circular column or cylinder. Electrical cables 9 for the resistance heater 4 and a thermo-sensor disposed in the worktable 3 are led out of the process chamber 2 through the hollow portion of the pedestal 5 and the bottom opening 6 of the process chamber 2.

The mount face 3a may be provided with a guide ring, positioning pins, or a recess, to suppress or prevent the wafer W from causing a large positional shift or falling down therefrom due to a transfer error or vibration. For example, although the wafer W may be displaced from the normal position due to the accuracy of an outer transfer arm (not shown) and so forth, the guide rind or the like allows the wafer W to stay near the normal position.

The bottom of the pedestal 5 is provided with a flange 5a, which is sandwiched between upper and lower flange holders 7 and 8 made of a metal, such as aluminum. The lower flange holder 8 is fixed by screws to the casing 2a of the process chamber 2 to airtightly close the bottom opening 6 of the process chamber 2 from inside. The upper and lower flange holders 7 and 8 are fixed to each other by screws, so that the pedestal 5 is supported by the casing 2a.

The casing 2a of the process chamber 2 is constituted of upper and lower casing parts, which are detachably joined at a position close to the middle in the vertical direction. The upper casing part, in which the worktable 3 is disposed, has a diameter larger than that of the lower casing part, in which the pedestal 5 is disposed. The casing 2a of the process chamber 2 has a ceiling, which is formed of an openable or detachable lid 11. The lid 11 has an opening 12 having a size larger than that of the worktable 3 at a position opposite to the worktable 3. A ring showerhead 13 made of quartz is disposed near the opening 12, and is connected to a gas supply section 13a for supplying a process gas containing an oxidizing gas, such as ozone ($O_3$). The showerhead 13 is provided with a number of gas spouting holes 14, which are formed at the bottom to spout a process gas, such as ozone, toward the wafer W on the worktable 3.

A transmission window 15, which is made of quartz and is transparent to ultraviolet (UV) rays, is airtightly attached to the upper portion of the lid 11 and covers the opening 12. A lamp chamber 16 is formed on the transmission window 16, and accommodates a plurality of UV lamps 17 facing the transmission window 15. UV rays emitted from the UV lamps 17 are transmitted through the window 15 and radiated onto the ozone gas supplied from the showerhead 13 in the space above the worktable 3. Consequently, the ozone is decomposed into oxygen ($O_2$) and oxygen radicals ($O^+$), which are then supplied onto the surface of the wafer W.

An exhaust port 18 is formed in the sidewall of the casing 2a of the process chamber 2 near the bottom. The exhaust port 18 is connected through an exhaust line 19 to an exhaust section 19a, which includes a pressure-reducing pump and a pressure controller for vacuum-exhausting the process chamber 2 and setting it at certain pressures. A transfer port 20 is formed in the sidewall of the casing 2a of the process chamber 2 near the top, for transferring the wafer W into and out of the process chamber 2 by an outer transfer arm (not shown). The port 20 is provided with a gate valve 21, which is airtightly opened/closed.

A plurality of, e.g., three, lifer pins 22 are disposed in the worktable 3, for transferring the wafer W between the outer transfer arm and the worktable 3. The lifter pins 22 project and retreat relative to the mount face 3a through respective lifter holes 23 formed through the worktable 3, so that they engage with the bottom surface of the wafer W. The lifter pins 22 are moved up and down by a driving section 24, such as an air cylinder, which is disposed outside the process chamber 2 and connected to the lifter pins 22 through a common elevating arm 25.

The resistance heater 4, gas supply section 13a, UV lamps 17, exhaust section 19a, lifter pins 22, and so forth are operated under the control of the CPU 10.

Figure 2:
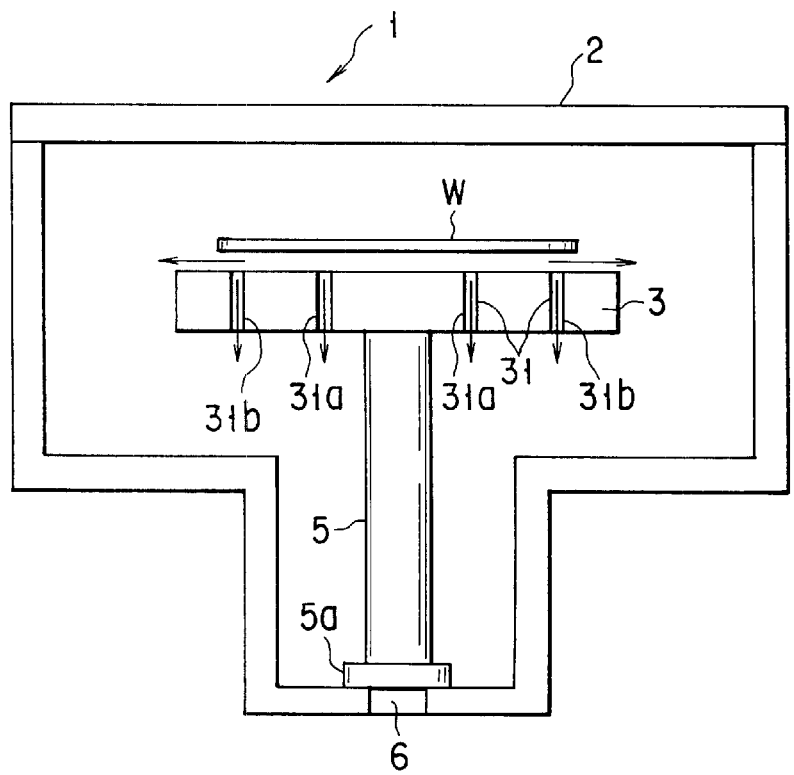
FIG. 2 is a diagram showing ventilation holes formed in a worktable adopted in the apparatus shown in FIG. 1, and the route of gas escaping from the bottom of a wafer.
Figure 3:
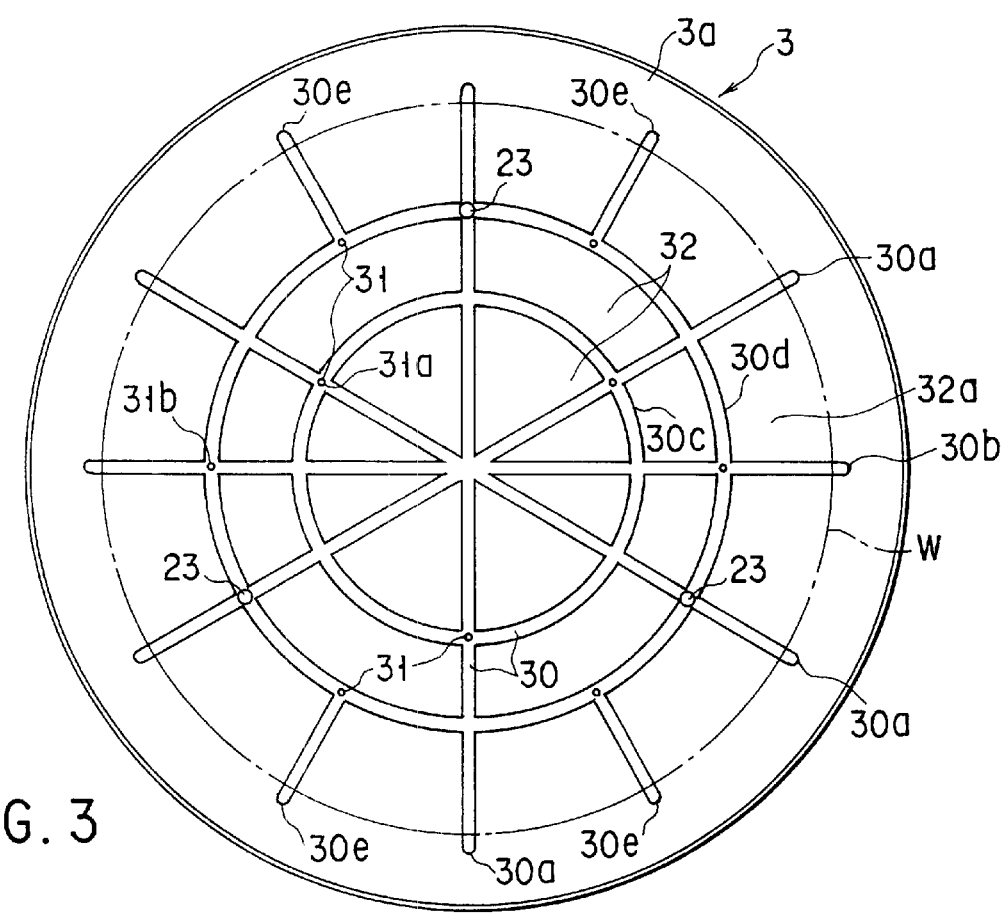
FIG. 3 is a plan view showing the mount face of the worktable adopted in the apparatus shown in FIG. 1.

FIG. 2 is a diagram showing ventilation holes 31 formed in the worktable 3, and the route of gas escaping from the bottom of the wafer W. FIG. 3 is a plan view showing the mount face 3a of the worktable 3.

As shown in FIG. 3, a plurality of ventilation grooves 30 are formed on the mount face 3a. The ventilation grooves 30 consist of three radial grooves 30a crossing the mount face 3a, one radial groove 30b crossing the mount face 3a similarly to the grooves 30a, two annular grooves 30c and 30d concentric about the center of the mount face 3a, and four radial grooves 30e extending outward from the outer annular groove 30d. All the grooves 30a to 30e are arranged point-symmetric with respect to the center of the mount face 3a. The three radial grooves 30a and the outer annular groove 30c are positioned to correspond to three lifter holes 23. The radial grooves 30a, 30b, and 30e are disposed equidistant in the angular direction at angles of 30°. The radial grooves 30a, 30b, and 30e respectively have outer ends extending outward beyond the contour of the wafer W placed on the mount face 3a.

As shown in FIG. 2, a plurality of ventilation holes 31 are formed vertically through the worktable 3. The ventilation holes 31 consists of three ventilation holes 31a disposed on the circle of the inner annular groove 30c, and six ventilation holes 31b disposed on the circle of the outer annular groove 30d. The ventilation holes 31a respectively communicate with the radial grooves 30a and the inner annular groove 30c at the intersections of them. The ventilation holes 31b respectively communicate with the radial grooves 30b and 30e and the outer annular groove 30d at the intersections of them. The lifter holes 23 respectively communicate with the radial grooves 30a and the outer annular groove 30d at the intersections of them.

As a result, the gap space between the wafer W and the mount face 3a communicates with the inner space of the process chamber 2 around the worktable 3 and the wafer W, through the ventilation grooves 30, the ventilation holes 31, and the lifter holes 23. With this arrangement, it is possible to allow the gas on the bottom of the wafer W to be released uniformly and swiftly when the wafer W is being placed on the worktable 3 or the process chamber 2 is being reduced in pressure, thereby preventing the wafer W from positionally shifting or laterally sliding.

The ventilation grooves 30 have a pattern forming islands 32 having surface areas similar to each other on the mount face 3a. The ventilation holes 31 are disposed at certain intervals to allow the gas present between the surfaces of the islands 32 and the bottom of the wafer W to be uniformly released. The islands 32 are respectively surrounded overall by grooves 30 except the outermost islands 32a. The outermost islands 32a respectively have one side facing the peripheral edge of the wafer W without any intervening grooves 30, while the other three sides being surrounded by the grooves 30, because the gas on the bottom of the wafer W can directly escape from the outermost islands 32a under the peripheral edge of the wafer W. Where the surface areas of the islands 32 including the outermost island 32a are similar to each other, and the distances between the center to the edge of the islands are similar to each other, it is possible to allow the gas present between the surfaces of the islands 32 and the bottom of the wafer W to be released uniformly and swiftly at substantially the same time.

The width of the ventilation grooves 30 is set to fall in a range of from 2 to 4 mm, and preferably of from 2 to 3 mm. The depth of the ventilation grooves 30 is set to fall in a range of from 0.1 to 1.0 mm, and preferably of from 0.1 to 0.3 mm. The diameter of the ventilation holes 31 is set to fall in a range of from 2 to 3 mm, and preferably of from 2 to 2.5 mm.

Figure 4:
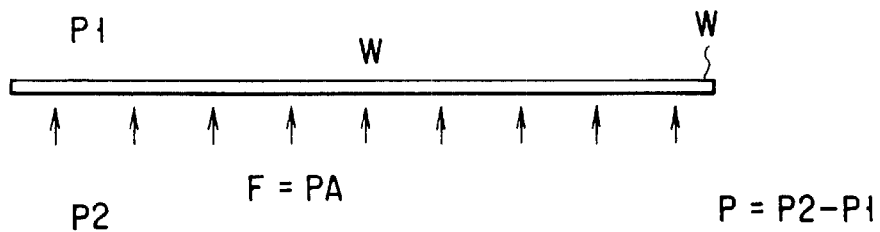
FIG. 4 is a view explaining the principle of a wafer floating.

FIG. 4 is a view explaining the principle of a wafer floating. As shown in FIG. 4, W denotes the weight of the wafer W, F denotes an upward force acting on the bottom of the wafer W, A denotes the surface area of the bottom of the wafer W, P1 denotes a pressure on the top side of the wafer W, P2 denotes a pressure on the bottom side of the wafer W, and P denotes the pressure difference between the bottom and top sides of the wafer W (P=P2−P1). Under this provision, where the wafer W is presumed to float due to the pressure difference P between the bottom and top sides, the following formula is satisfied.

F>W

Where the wafer W has a diameter D of 200 mm, a thickness t of 0.725 mm, and a density ρ of 0.24 Kg/m³, the weight W is expressed as follows:

W=πD²/4×t×ρ=0.53508N (0.0546 Kgw)

Let F=W be assumed, since F=PA, the pressure difference P is expressed as follows:

P=W/A=W/(πD²/4)=17.032 N/m2=16.93 Pa (127 mTorr).

The same calculation can be applied to other diameters of the wafer, and the results are as follows:

Where the wafer has a diameter of 300 mm, P=17.73 Pa (133 mTorr).

Where the wafer has a diameter of 350 mm, P=18.26 Pa (137 mTorr).

Where the wafer has a diameter of 400 mm, P=18.79 Pa (141 mTorr).

Accordingly, where the wafer W has a diameter of 200 mm, the wafer W floats due to the pressure of the gas on the bottom of the wafer W when the pressure difference between the bottom and top sides of the wafer W becomes 16.93 Pa (127 mTorr) or more by a vacuum-exhaust or the like. On the other hand, in any diameter of the wafer, the wafer W does not float when the pressure difference is not more than about 13.3 Pa (100 mTorr).

In accordance with the aspect described above, the ventilation grooves 30, the ventilation holes 31, and the lifter holes 23 are designed such that the pressure difference P between the bottom and top sides of the wafer W cannot increase beyond 13.3 Pa in the operation range of the processing apparatus 1. With this arrangement, it is possible to prevent the wafer from floating up or laterally sliding due to the pressure of the gas present between the bottom of the wafer W and the mount face 3a, when the process chamber 2 is being reduced in pressure.

Incidentally, as the case may be, the processing apparatus has to be used with a high process pressure, such as 11,998 Pa (90 Torr) or 53,328.8 Pa (400 Torr). Where the pressure in the process chamber 2 is quickly reduced from such a high process pressure to a vacuum-purging pressure of, e.g., about 20 Pa (150 mTorr), the pressure difference on the wafer W becomes about 240 to 3,200 times larger than the floating limit pressure of 16.9 Pa. In this case, the ventilation grooves 30 and the ventilation holes 31 formed in the worktable 3 cannot allow the gas on the bottom of the wafer W to be released in such a short time. Accordingly, in such a case, under the control of the CPU 10, when the pressure in the process chamber 2 is reduced by the exhaust section 19a, the wafer W is moved up from the mount face 3a by the lifter pins 22, so that the gas on the bottom of the wafer W is released.

When the wafer W is being placed on the worktable 3, part of the wafer W starts coming into contact with the mount face 3a from the time when the floating level of the wafer W is 0.05 mm or less. If the surface of the worktable 3 is formed of a material, which is smooth and slippery, such as a ceramic of AlN or SiC, the wafer W easily slips laterally. In order for the wafer W not to easily slip, the mount face 3a has been subjected to a surface treatment for increasing the frictional resistance, such as a roughening treatment by means of blast. The mount face 3a has a surface roughness with an arithmetical means deviation of profile Ra of from 1.0 to 4.0 (μm), and preferably of from 2.0 to 3.0 (μm).

An explanation will be given of an operation of the single-substrate-processing apparatus having the above-described constitution.

First, the gate valve 21 of the port 20 is opened, and a wafer W is transferred into the process chamber 2 by the outer transfer arm. The lifter pins 22 are moved up to receive the wafer W from the outer transfer arm. Then, the lifter pins 22 are moved down to place the wafer W on the top of the worktable 2. After the outer transfer arm retreats out of the process chamber 2, the gate valve 21 is closed.

Then, the wafer W is heated to a predetermined process temperature by the resistance heater 4 disposed in the worktable 3. The process chamber 2 is supplied with ozone gas, i.e., a process gas, while the process chamber 2 is exhausted, so that the interior of the process chamber 2 is kept at a predetermined process pressure. The ozone gas is spouted from the holes 14 of the showerhead 13 toward the wafer W on the worktable 3. At the same time, the UV lamps 17 in the lamp chamber 16 are turned on to emit UV rays. The UV rays are transmitted through the window 15 and radiated onto the process gas containing ozone as the main component, above the worktable 3 in the process chamber 2. The ozone is decomposed into oxygen and oxygen radicals, due to irradiation with the UV rays. The wafer W on the worktable 3 is subjected to a predetermined process, i.e., oxidation, with the oxygen radicals.

In the single-substrate-processing apparatus 1 shown in FIG. 1, the ventilation grooves 30 are formed on the mount face 3a. Furthermore, the lifter holes 23 and the ventilation holes 31 are formed through the worktable 3 and respectively communicate with the grooves 30. The ventilation grooves 30 have a pattern forming islands 32 having surface areas similar to each other on the mount face 3a. The ventilation holes 31 are disposed to allow the gas present between the surfaces of the islands 32 and the bottom of the wafer W to be uniformly released. The gas present between the mount face 3a and the wafer W is released uniformly and swiftly through the ventilation grooves 30, the ventilation holes 31, and the lifter holes 23, when the wafer W is being placed on the worktable 3 or the process chamber 2 is being reduced in pressure. As a result, the wafer W is prevented from laterally sliding on the worktable 3 and thus from bringing about a problem in that the wafer laterally slides and causes friction with an underlayer or hits a guide ring or the like, thereby generating particles.

The worktable is preferably made of a ceramic and includes the resistance heater 4 disposed therein, so that it can swiftly heat the wafer W. Although the ceramic tends to make the mount face 3a slippery, the wafer W is prevented by the ventilation grooves 30 and the ventilation holes 1 from laterally sliding. In addition, the mount face 3a has been subjected to the roughening treatment, the wafer W is further prevented from laterally sliding.

Experiment

In order to confirm the effect of the ventilation grooves 30 and the ventilation holes 31, an experiment was conducted, using an apparatus according the embodiment shown in FIG. 1, and a conventional apparatus including no ventilation grooves 30 or ventilation holes 31. In this experiment, both the apparatuses were subjected to measurement of a landing time when a wafer was being placed on a worktable, and measurement of a floating level of a wafer when a process chamber was being reduced in pressure.

Figure 5:
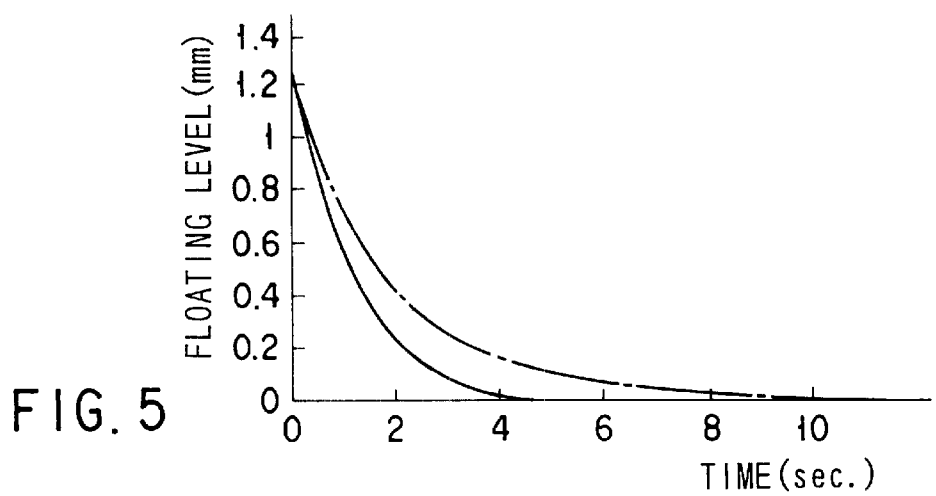
FIG. 5 is a graph showing a relationship between the floating level of a wafer and time when the wafer was being placed on a worktable.
Figure 6:
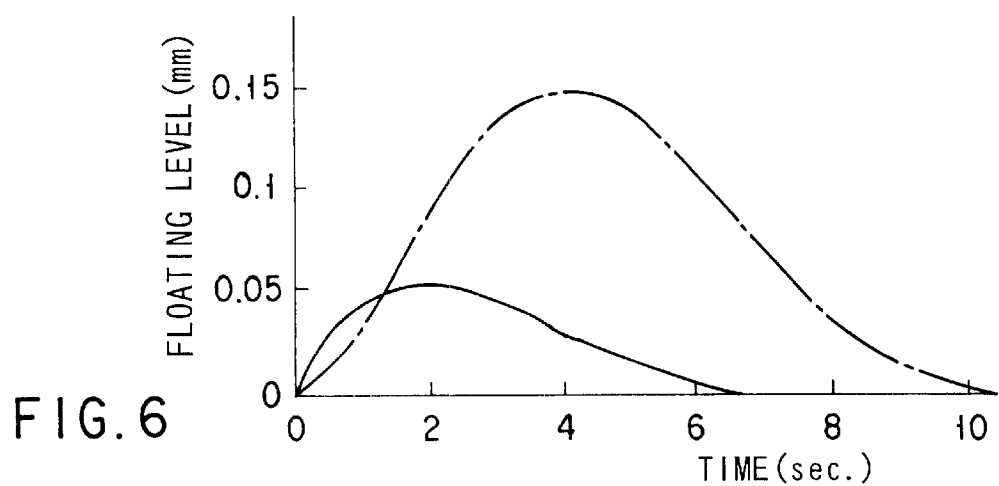
FIG. 6 is a graph showing a relationship between the floating level of a wafer and time when a process chamber was being reduced in pressure.

FIG. 5 is a graph showing a relationship between the floating level of a wafer and time when the wafer was being placed on a worktable. FIG. 6 is a graph showing a relationship between the floating level of a wafer and time when a process chamber was being reduced in pressure. In each of FIGS. 5 and 6, the solid line and the one-dot-chain line denote data of the apparatus according to the embodiment and the conventional apparatus, respectively.

When a wafer is being placed on a worktable by lifter pins moved down, the gas present between the wafer and the worktable has to be released. In this operation, the conventional apparatus did not easily release the gas on the bottom of the wafer, and thus took about 10 seconds for the wafer to completely land on the worktable, as shown by the one-dot-chain line in FIG. 5. On the other hand, the apparatus according to the embodiment took a shorter time of about 5 seconds for the wafer to land, as shown by the solid line in FIG. 5. Accordingly, the effect of the ventilation grooves 30 and the ventilation holes 31 was confirmed.

When a process chamber is quickly reduced in pressure from a certain process pressure of, e.g., from about 3,999 to 9,332 Pa (from 30 to 70 Torr) to a vacuum-purging pressure of, e.g., about 20 Pa (150 mTorr), the gas present between a wafer and a worktable expands. With the pressure of the expanded gas, the wafer floats up, and the gas present between the wafer and the worktable escapes therefrom. In this operation, the conventional apparatus showed a floating level of about 0.12 mm, and took about 10 seconds for the wafer to land, as shown by the one-dot-chain line in FIG. 6. On the other hand, the apparatus according to the embodiment showed a floating level of about 0.05 mm, and took about 7 seconds for the wafer to land, as shown by the solid line in FIG. 6. Accordingly, the effect of the ventilation grooves 30 and the ventilation holes 31 was confirmed.

Figure 7:
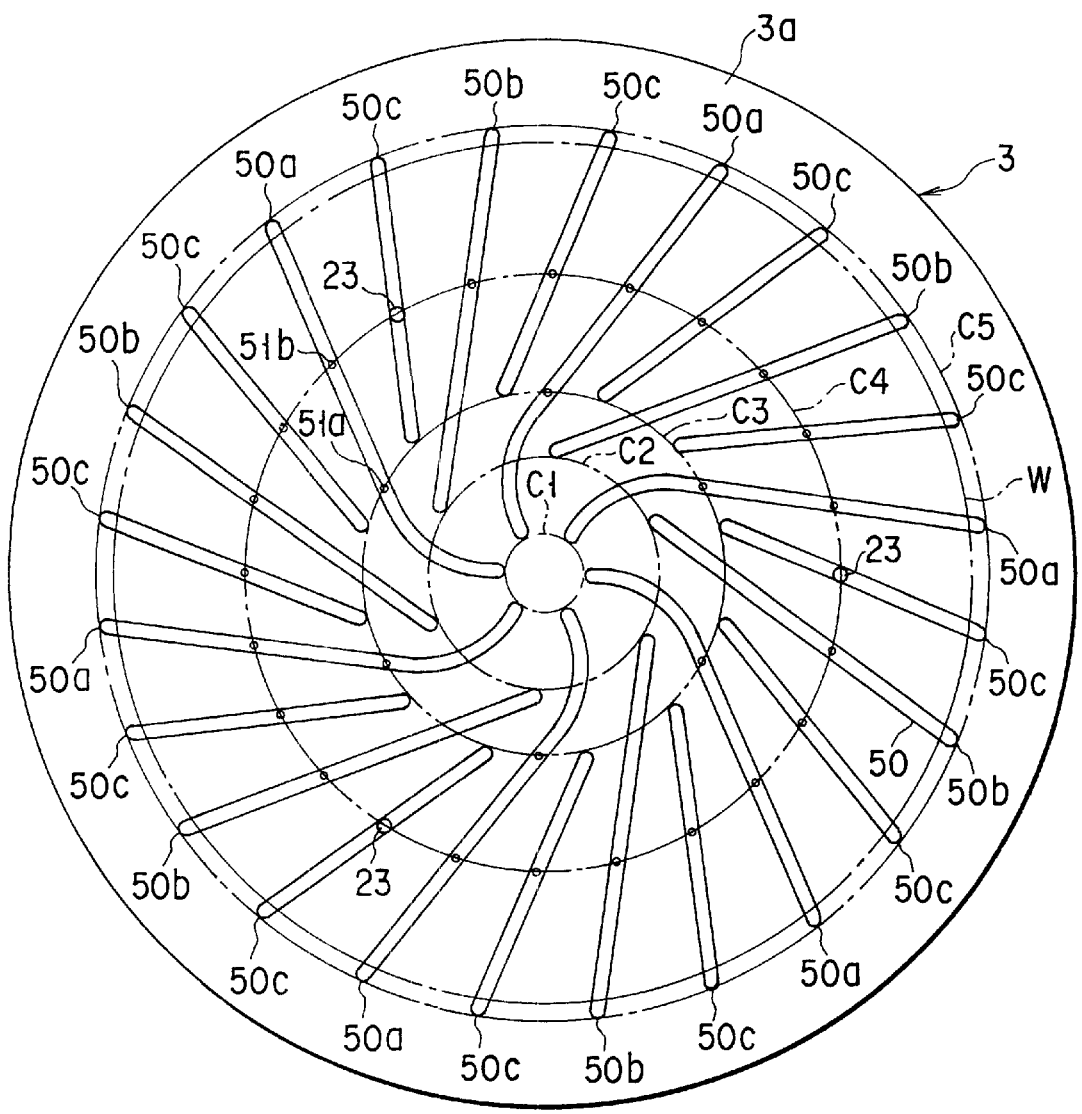
FIG. 7 is a plan view showing the mount face of a worktable adopted in an apparatus according to another embodiment of the present invention.

FIG. 7 is a plan view showing the mount face of a worktable adopted in an apparatus according to another embodiment of the present invention.

As shown in FIG. 7, the worktable 3 according to this embodiment has a mount face 3a on which a plurality of ventilation grooves 50 are formed along involute lines. Note that the involute pattern is one of radial patterns according to the present invention. The ventilation grooves 50 consist of six grooves 50a disposed equidistant in the angular direction and extending from near the center of the mount face 3a to be longest in length, six grooves 50b disposed between respective pairs of the grooves 50a and having an intermediate length, and twelve grooves 50c disposed between respective pairs of the grooves 50a and 50b being shortest in length. All the grooves 50a to 50c are arranged equidistant in the angular direction and point-symmetric with respect to the center of the mount face 3a.

Among the ventilation grooves 50, the grooves belonging to the same respective groups have inner ends, which are disposed on the same respective circles C1, C2, and C3. The circle C2, on which the inner ends of the grooves 50b having an intermediate length are disposed, is positioned almost midway between the circle C1, on which the inner ends of the longest grooves 50a are disposed, and the circle C3, on which the inner ends of the shortest grooves 50c are disposed. On the other hand, all the ventilation grooves 50a to 50c have outer ends, which extend outward beyond the contour of the wafer W placed on the mount face 3a, and are disposed on the same circle C5.

A plurality of ventilation holes 51 and three lifter holes 23 for lifter pins are formed vertically through the worktable 3. The ventilation holes 51 gconsist of six ventilation holes 51a disposed on the circle C3, and twenty-one ventilation holes 51b disposed on a circle C4, which is positioned almost midway between the circles C3 and C5. The lifter holes 23 are also disposed on the circle C4. The lifter holes 23 respectively communicate with three of the shortest grooves 50c. The inner ventilation holes 51a respectively communicate with the longest grooves 50a. The outer ventilation holes 51b respectively communicate with the grooves 50a to 50c, except the three shortest grooves 50c communicating with the lifter holes 23.

As a result, the gap space between the wafer W and the mount face 3a communicates with the inner space of the process chamber 2 around the worktable 3 and the wafer W, through the ventilation grooves 50, the ventilation holes 51, and the lifter holes 23. With this arrangement, it is possible to allow the gas on the bottom of the wafer W to be released uniformly and swiftly when the wafer W is being placed on the worktable 3 or the process chamber 2 is being reduced in pressure, thereby preventing the wafer W from positionally shifting or laterally sliding.

The present invention may be applied to a worktable other than a worktable with a built-in heater, such as a worktable that is heated from the bottom by a resistance heater or a heating lamp. Furthermore, the present invention may be applied to a processing apparatus, other than an oxidizing apparatus, such as a diffusing, film forming, etching, or annealing apparatus. Furthermore, the present invention may be applied to a target substrate other than a semiconductor wafer, such as an LCD substrate, or a glass substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A single-substrate-processing apparatus for performing a semiconductor, comprising:

an airtight process chamber;

a worktable having a mount face configured to horizontally support a target substrate within the process chamber;

a supply section configured to supply a process gas into the process chamber;

an exhaust section configured to vacuum-exhaust the process chamber;

a plurality of lifter pins configured to move the target substrate to and from the mount face, the lifter pins being respectively disposed in lifter holes formed through the worktable;

a plurality of ventilation holes formed through the worktable; and a plurality of ventilation grooves formed on the mount face, and comprising first ventilation grooves communicating with the lifter holes and second ventilation grooves communicating with the ventilation holes;

wherein a gap space between the target substrate and the mount face communicates with an inner space of the process chamber around the worktable through the first and second ventilation grooves, the ventilation holes, and the lifter holes.

2. The apparatus according to claim 1, wherein the first and second ventilation grooves, the ventilation holes, and the lifter holes are arranged substantially point-symmetric with respect to a center of the mount face.

3. The apparatus according to claim 1, wherein the first and second ventilation grooves, the ventilation holes, and the lifter holes are arranged to cause the gap space to uniformly communicate with the inner space.

4. The apparatus according to claim 1, further comprising a pedestal standing upright in the process chamber and supporting the worktable, wherein the lifter holes and the ventilation holes have openings surrounding the pedestal on a bottom of the worktable.

5. The apparatus according to claim 1, wherein the first ventilation grooves comprise radial grooves.

6. The apparatus according to claim 5, wherein the first ventilation grooves further comprise an annular groove.

7. The apparatus according to claim 5, wherein the first ventilation grooves have outer ends extending outward beyond the contour of the target substrate placed on the mount face.

8. The apparatus according to claim 1, wherein the second ventilation grooves are independent of each other and respectively communicate with the ventilation holes.

9. The apparatus according to claim 1, wherein the radial grooves of the first and second ventilation grooves comprise radial grooves disposed substantially equidistant in an angular direction.

10. The apparatus according to claim 1, wherein the ventilation grooves have a width of from 2 to 4 mm.

11. The apparatus according to claim 2, wherein the first and second ventilation grooves, the ventilation holes, and the lifter holes are arranged such that a pressure difference between bottom and top sides of the target substrate does not increase beyond 13.3 Pa in an operation range of the processing apparatus.

12. The apparatus according to claim 1, wherein the mount face has a surface roughness with an arithmetical means deviation of profile Ra of from 1.0 to 4.0 μm.

13. The apparatus according to claim 1, further comprising a controller configured to control the exhaust section and the lifter pins, such that the target substrate is moved up from the mount face by the lifter pins when the process chamber is reduced in pressure by the exhaust section.

14. The apparatus according to claim 1, wherein the heater is disposed in the worktable.

15. The apparatus according to claim 14, wherein the worktable comprises a ceramic body, and the heater comprises a resistance heater embedded in the ceramic body.

16. The apparatus according to claim 1, wherein the second ventilation grooves comprises radial grooves.

17. The appatatus according to claim 16, wherein the radial grooves of the second ventilation grooves respectively have outer ends extending outward beyond a contour of the target substrate placed on the mount face, and the gap space communicates with the inner space around the worktable and the target substrate through the first and second ventilation grooves, the ventilation holes, and the lifter holes.

18. The apparatus according to claim 16, wherein the second ventilation grooves further comprise an annular groove.

19. The apparatus according to claim 17, further comprising a heater configured to heat the target substrate through the mount face.

* * * * *